(12) United States Patent
Kern

(10) Patent No.: US 12,282,046 B2
(45) Date of Patent: Apr. 22, 2025

(54) MAGNETIC FIELD SENSOR FOR MEASURING A DIRECT CURRENT

(71) Applicant: SOCOMEC, Benfeld (FR)

(72) Inventor: Christian Kern, Kaysersberg Vignoble (FR)

(73) Assignee: SOCOMEC, Benfeld (FR)

( * ) Notice: Subject to any disclaimer, the term of this patent is extended or adjusted under 35 U.S.C. 154(b) by 0 days.

(21) Appl. No.: 18/727,880

(22) PCT Filed: Dec. 13, 2022

(86) PCT No.: PCT/EP2022/085493
§ 371 (c)(1),
(2) Date: Jul. 10, 2024

(87) PCT Pub. No.: WO2023/174572
PCT Pub. Date: Sep. 21, 2023

(65) Prior Publication Data
US 2025/0102544 A1    Mar. 27, 2025

(30) Foreign Application Priority Data

Mar. 18, 2022    (FR) ........................................ 2202411

(51) Int. Cl.
*G01R 15/18*    (2006.01)
*G01R 19/00*    (2006.01)

(52) U.S. Cl.
CPC ....... *G01R 15/185* (2013.01); *G01R 19/0092* (2013.01)

(58) Field of Classification Search
CPC ........ G01R 15/00; G01R 15/14; G01R 15/18; G01R 15/183; G01R 15/185; G01R 19/00; G01R 19/0084; G01R 19/0092
(Continued)

(56) References Cited

U.S. PATENT DOCUMENTS 10,495,605 B2    12/2019  Augais
2018/0188206 A1   7/2018  Augais
(Continued)

FOREIGN PATENT DOCUMENTS

CN    101019006 A    8/2007
CN    105659053 A    6/2016
(Continued)

OTHER PUBLICATIONS

Xiaohu, Z., et al., "Development of eddy current sensors based on UV-LIGA technology"; China Mechanical Engineering, vol. 18, No. 18, Sep. 2007.

*Primary Examiner* — Hoai-An D. Nguyen
(74) *Attorney, Agent, or Firm* — FORGE IP, PLLC

(57) ABSTRACT

A magnetic field sensor for measuring a direct current includes a transducer formed of coils with superparamagnetic core in series; an excitation module generating an excitation current at an excitation frequency, via a midpoint coil, an excitation voltage generator and an excitation impedance. An analysis module includes an analysis impedance coupled to the midpoint coil, and an analyzer that analyzes the current passing through the analysis impedance to extract a component at an analysis frequency equal to an even multiple of the excitation frequency. The excitation impedance forms with the superparamagnetic coils a first series RLC circuit with a resonance frequency, which is substantially equal to the excitation frequency, and a second series RLC-type circuit with an analysis resonance frequency, which is substantially equal to the analysis frequency.

20 Claims, 8 Drawing Sheets

(58) Field of Classification Search
USPC .................................... 324/76.11, 126, 127
See application file for complete search history.

(56) References Cited

U.S. PATENT DOCUMENTS

| | | |
|---|---|---|
| 2018/0196087 A1 | 7/2018 | Augais |
| 2024/0230741 A1* | 7/2024 | Je .................... G01R 19/0092 |

FOREIGN PATENT DOCUMENTS

| | | |
|---|---|---|
| CN | 113325086 A | 8/2021 |
| DE | 102005038655 B3 | 3/2007 |
| EP | 3314281 B1 | 9/2019 |

* cited by examiner

MAGNETIC FIELD SENSOR FOR MEASURING A DIRECT CURRENT

TECHNICAL FIELD

The present invention relates to a device for contactlessly measuring an electric current circulating in a conductor by way of measuring the magnetic field induced by this current. The invention relates more specifically to a magnetic field sensor integrating a transducer based of a superparamagnetic material, adapted for measuring direct current.

PRIOR ART

To measure a current I, different physical principles can be used to generate a physical quantity representative of this current I. For example, the magnetic sensors implement transducers which are sensitive to magnetic quantities, such as the magnetic field, induced by the current to be measured.

In particular, current sensors implementing the so-called Néel Effect® technology are known, for example in document FR2891917. The specificity of this technology is based on using a transducer consisting of coils, the cores of which are based of a nanoparticle-charged composite having superparamagnetic properties. The superparamagnetic material used having the specificity of being free of hysteresis, this type of transducer thus has the advantage of not having magnetic offset.

In a simplified manner, the coil with superparamagnetic core (or SPM coil) acts as a frequency mixer. When an SPM core is passed through by a known frequency excitation current Fexc, and in the absence of external magnetic field to be measured Hext, the electromotive force (EMF) induced at the terminals of this coil will not have even order harmonics. On the contrary, the appearance of an external magnetic field to be measured Hext will induce the appearance of even order harmonics based on the information on the magnetic field to be measured. In practice, the amplitude and the even harmonics phase, and in particular, that of the order 2 harmonics make it possible respectively to access the amplitude and the polarity of the primary field. A feedback circuit can be coupled to the system to reduce possible interfering information due to the distortions induced by the system, and deliver a more usable measuring quantity, for example directly proportional to the current to be measured.

Such a current sensor is, for example, described succinctly in document FR2980581, but the configuration proposed assumes the use of a specific signal generator, capable of generating an ideal wave excitation signal, i.e. a signal for which the amplitudes of the even harmonics are zero. Yet, a signal generated by way of a PWM (pulse width modulation)-type generator or an analogue-to-digital converter (ADC) necessarily contains harmonics, and in particular, the order 2 harmonics, the level of which can be significant, and which is located in the signal provided by the SPM coil, requiring the implementation of a complex processing to extract the useful signal.

Document FR3038063 proposes a sensor integrating a transducer formed of four SPM coils and coupled to two excitation generators, namely a high-frequency generator $F_{HF}$ of current $I_{HF}$ and a low-frequency generator $F_{BF}$ of current $I_{BF}$. The sensor is, in particular, configured such that the coils are passed through by excitation currents which make it possible to obtain, at the output of the transformer, a signal only containing the useful frequencies $F_{HF}-F_{BF}$ and $F_{HF}+F_{BF}$. In this way, even in the presence of harmonic residues in the signals $I_{HF}$ and $I_{BF}$, the useful signal at the output, in particular of the transformer used for detection is not affected by the quality of the excitation signals. This configuration however involves choosing a frequency $F_{BF}$ which is a lot lower than the frequency $F_{HF}$, such that the two frequencies present in the useful output signal are relatively close and distant from $2 \cdot F_{BF}$ only. This low frequency gap leads to the necessity to use a relatively low cutoff frequency demodulation filter, in particular lower than $2 \cdot F_{BF}$, which causes a long response time and a limited bandwidth of the system. Moreover, the inevitable imbalance of the SPM coils will also cause the appearance of a component at the frequency $F_{HF}$ close to the two useful frequencies $F_{HF}-F_{BF}$ and $F_{HF}+F_{BF}$. The high amplification of the useful frequencies to obtain a good signal-to-noise ratio being necessary, the presence of this component $F_{HF}$ is therefore hindering and difficult to filter due to its proximity with the useful frequencies. A selective bandstop filter can be added to limit the problem, but further to the complex and delicate production of such a selective filter, its integration increases the response time of the system. Moreover, the use of two excitation generators for injecting two frequencies induces a significant cost to the solution.

DISCLOSURE OF THE INVENTION

The aim of the present invention therefore aims to propose an alternative direct current or direct magnetic field sensor, integrating coils with superparamagnetic core. The invention in particular aims to propose a configuration making it possible to improve the signal-to-noise ratio of the system, which does not require the use of very expensive components, nor the implementation of bulky circuits, nor a complex production.

The invention thus aims for a magnetic field sensor for measuring a direct current, formed of at least one superparamagnetic SPM material transducer, intended to be subjected to an external magnetic field to be measured, and electrically coupled to an excitation module and to an analysis module.

According to the invention, the transducer comprises at least one pair of coils with superparamagnetic SPM core, the SPM coils being substantially identical and being connected in series between two extreme terminals of the transducer, the common connection point of the SPM coils being connected to a reference potential.

Furthermore, the excitation module is configured to generate and inject an excitation current Ie into the transducer, at a predefined excitation frequency Fe, and comprises at least:
  a midpoint coil mounted in parallel to the terminals of the transducer;
  an excitation voltage generator mounted between the reference potential and said midpoint, this voltage generator preferably being with an adjustable or tuneable frequency; and
  an excitation impedance configured to form with the SPM coils a first series RLC-type circuit with a resonance frequency Fres_e substantially equal to the excitation frequency Fe.

Moreover, the analysis module comprises at least:
  an analysis impedance connected to the external terminals of the midpoint coil, the excitation impedance being configured to form with the SPM coils a second series RLC-type circuit with an analysis resonance frequency Fres_a substantially equal to an analysis frequency Fa; and a means for analysing the current passing through the analysis impedance at the analysis frequency Fa to extract a component at said analysis frequency Fa equal to an even multiple of the excitation frequency Fe.

Advantageously, the analysis frequency Fa is equal to 2·Fe.

According to an embodiment, the excitation impedance is connected between the excitation generator and the midpoint of the midpoint coil.

According to another embodiment, the excitation impedance is connected between the reference potential and the common connection point of the SPM coils.

According to a variant, the excitation impedance comprises at least one excitation capacitor.

According to another variant, the excitation impedance comprises at least one excitation capacitor and one excitation inductor, the excitation inductor being connected between the excitation capacitor and the excitation voltage generator.

In practice, the midpoint coil can consist of two substantially identical windings, wound over one same magnetic core.

Advantageously, the analysis impedance can be constituted by an analysis capacitor and an analysis resistor mounted in series between the two external terminals of the midpoint coil.

The analysis impedance can also comprise an analysis inductor mounted in series with the analysis capacitor and the analysis resistor between the external terminals of the midpoint coil.

According to another embodiment, the magnetic field sensor can further comprise a transformer mounted between the midpoint coil and the analysis impedance, said transformer being constituted by a primary winding and a secondary winding, the primary winding being connected to the external terminals of the midpoint coil, and the secondary winding being connected to the terminals of the analysis impedance.

According to another embodiment, the magnetic field sensor can further comprise a transformer comprising a primary winding formed of the midpoint coil and of a secondary winding connected to the terminals of the analysis impedance.

According to another embodiment, the SPM coils of the transducer forms a first pair of SPM coils, and the sensor can further comprise a second pair of SPM coils which are substantially identical to said first pair of SPM coils. In this other embodiment, the SPM coils of the second pair are mounted in series, the extreme terminal of the first pair of SPM coils is connected to one of the coils of the second pair, and the extreme terminal of the first pair of SPM coils is connected to the other coil of the second pair.

Advantageously, the sensor can further comprise a feedback module formed of at least one feedback voltage generator configured to generate a feedback current. In the case of a sensor with two SPM coils, the feedback voltage generator is preferably mounted at the extreme terminals of the transducer, and in the case of a sensor with four SPM coils, the feedback voltage generator is preferably mounted between the SPM coils of the second pair and configured to generate a feedback current.

According to a variant, the feedback voltage generator can be formed of two voltage sources referenced at the reference potential.

According to another embodiment, the magnetic field sensor can further comprise a calibration module, configured to seek an optimal value Fopt of the excitation frequency Fe to be injected into the transducer.

In a variant, the calibration module can be configured to:
vary the excitation frequency Fe of the excitation generator in a frequency range [Fe_min; Fe_max] and measure the corresponding excitation currents Ie; and
identify the optimal excitation frequency Fopt_e corresponding to the excitation frequency Fe for which the excitation current level Ie is maximum.

For example, the calibration module can be configured to measure the excitation current at the terminals of a resistor mounted between the reference potential and the common connection point of the SPM coils of the transducer.

The calibration module can also be configured to measure the excitation current at the terminals of an excitation capacitor when the excitation impedance is mounted between the reference potential and the common connection point of the two SPM coils of the transducer.

In another variant, the calibration module can be configured to:
vary the excitation frequency Fe of the excitation generator in a frequency range [Fe_min; Fe_max] and measure the sensitivity S of the excitation module;
identify the optimal excitation frequency Fopt_e corresponding to the excitation frequency Fe for which said sensitivity S is maximum.

BRIEF DESCRIPTION OF THE DRAWINGS

Other features and advantages of the present invention will be more clearly understood upon reading the following description, given with reference to the accompanying drawings, which are provided as non-limiting examples, in which.

DESCRIPTION OF THE EMBODIMENTS

Figure 1:
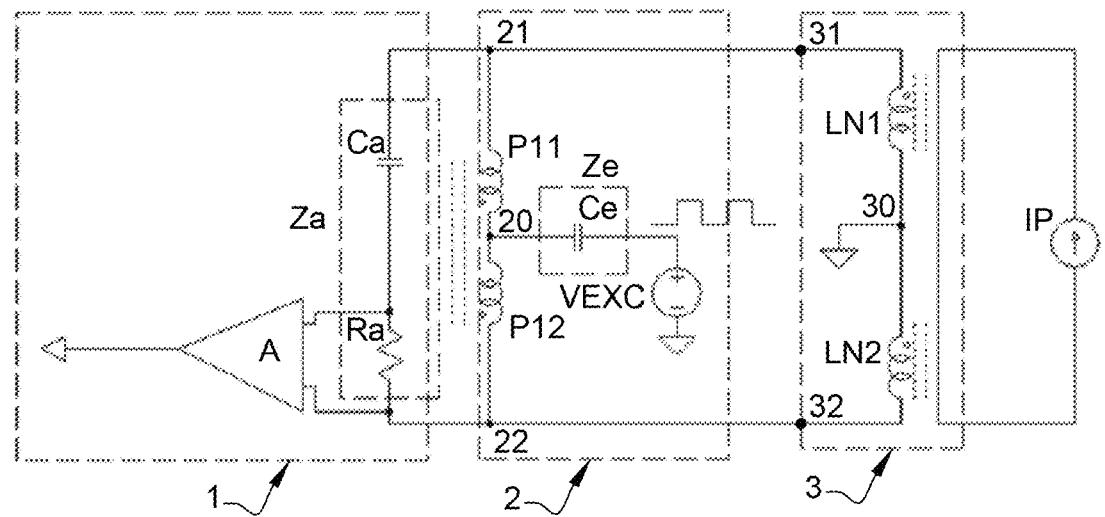
FIG. 1 is a simplified electronic diagram of the sensor according to an embodiment, in which the impedance Ze is formed of a capacitor Ce.

A sensor of the invention comprises a transducer formed of at least one pair of coils with superparamagnetic core (SPM below) coupled to an excitation module and to a conditioner module or analysis module. The transducer is intended to be subjected to an external magnetic field to be measured. In practice, the external magnetic field to be measured includes the frequencies going from direct to a frequency substantially lower than the excitation frequency, preferably at least ten times lower. The excitation module is configured to generate and inject an excitation signal into the transducer, for example in the form of a so-called "excitation" current of frequency corresponding to a predefined excitation frequency Fe. The conditioner module is configured to recover and analyse a raw SPM measuring signal, for example EMF, at the terminals of the transducer, representative of the time variation of the magnetic induction in the SPM coils. Analysing this raw SPM signal consists, in particular, of the generation of an easily usable useful signal containing useful information representative of the magnetic field or of the current to be measured. The analysis comprises, for example, the removal of undesirable frequency components of the SPM signal to only keep the useful frequency component of the SPM signal.

Thus, contrary to the solution described in document FR3038063A1, a single excitation frequency Fe, in particular a high excitation frequency, is used in the sensor, and the useful information relating to the magnetic field or current to be measured are therefore located in the even order harmonics of the SPM measuring signal. Due to this, analysing the SPM signal can consist of isolating or of extracting the frequency component located at an even multiple of the excitation frequency Fe. In other words, analysing the SPM signal must be done at an analysis frequency Fa equal to an even multiple of the excitation frequency Fe, preferably to the frequency 2·Fe for which the level of the SPM signal is maximum.

In practice, the injection of a single excitation frequency Fe in the SPM coils involves the use of a quality excitation signal, in order to limit, to the maximum, the interfering signals which are able to be located in the raw SPM measuring signal and able to complexify its processing or the extraction of useful information.

In particular, an interfering signal at the excitation frequency Fe can appear at the receiving chain of the conditioner module. It is however possible to reduce its level relatively simply without affecting the response time of the system too much, as the gap between the analysis frequency Fa and the interfering frequency is equal to Fe. An low to average selectivity filter not affecting the bandwidth of the system too much can, for example, be used.

Moreover, the SPM coils act as a frequency mixer, the presence of harmonics components in the excitation current can induce, in the SPM measuring signal, interfering components of significant level able to submerge the useful component. As an example, with a single-frequency excitation field of 500 A/m and a field to be measured of 1 A/m, the useful component for measuring the superparamagnetic effect (namely the order 2 harmonics of the excitation frequency, i.e. at the frequency 2·Fe) has an amplitude of around 20 mA/m. If the excitation field has a 2 harmonics rate of 0.01%, that is 50 mA/m, the signal measured in the absence of field to be measured corresponds to around 2.5 A/m, therefore broadly greater than the useful component. Yet, obtaining a harmonics rate for order 2 of 0.01% is particularly difficult and directly measuring a component representative of 0.004% of the total signal is particularly difficult.

In practice, these second harmonics in the excitation current are very difficult to avoid.

For example, generating an excitation current with pulse width modulation-type techniques, the order 2 harmonics are necessarily present due to the increasing and decreasing time differences, but also due to the output resistance differences between the high state and the low state.

With signal synthesis-based excitation current generation techniques with digital-to-analogue converter and power amplifier, the sources of the 2 harmonics are located in the non-linearities of the digital-to-analogue converter and of the amplifier. The active filtering of the signal coming from the digital-to-analogue converter makes it possible to obtain a signal with a low order 2 harmonics rate, if the output current is low. Yet, the necessary excitation current can be between a few tens and a few hundred mA. The amplifiers available on the market offering low distortion rates for these current levels and these frequencies are rare and expensive, and producing a power stage with discrete components which are compatible with the required performance is complex and bulky.

In order to be able to use inexpensive amplifiers on the market or a pulse width modulation system, while ensuring a low 2 harmonics rate, a solution to improve the quality of the excitation signal injected into the SPM coils can consist of inserting an excitation impedance Ze in the excitation circuit or module.

Embodiment with 2 SPM Coils, Ze=Ce

An electronic mounting of the sensor according to a first embodiment is illustrated in FIG. 1, in which an excitation impedance Ze comprising a capacitor Ce, is added to attenuate the order 2 harmonics component, i.e. at 2·Fe, in the excitation signal.

The sensor comprises a transducer 3 formed of a pair of SPM coils, identified respectively by LN1 and LN2 in FIG. 1, of inductor LN, mounted in series between the two extreme terminals 31, 32 of the transducer. The common connection point 30 at the two coils LN1 and LN2 is connected to a reference potential, for example, a ground. The coils LN1 and LN2 are intended to be subjected to an external magnetic field to be measured induced, for example, by a primary current source IP.

The sensor further comprises an excitation module 2 electrically coupled to the transducer 1 and configured to generate and inject an excitation current into the transducer 1, at a predefined excitation frequency Fe. The excitation module 2 comprises:
 a midpoint coil P11-P12, consisting of two substantially identical windings, wound over one same magnetic core;
 an excitation voltage generator VEXC at a frequency equal to the excitation frequency Fe;
 an excitation impedance Ze comprising a capacitor Ce.

The two external terminals 21, 22 of the coil P11-P12 are connected respectively to the two extreme terminals 31, 32 of the transducer 3, the capacitor Ce of the excitation impedance Ze is connected between the excitation generator VEXC and the midpoint 20 of the coil P11-P12.

The coils LN1 and LN2 of the transducer 3 constitute a series resistor/inductor (RI)-type charge. Inserting the capacitor Ce between the midpoint coil P11-P12 and the excitation voltage generator VEXC means charging it with a series RLC-type circuit, characterised by its resonance frequency Fres_e, below called "excitation resonance frequency". This excitation resonance frequency Fres_e is defined by:

$$F_{res\_e} = \frac{1}{2\pi\sqrt{\frac{L_N}{2}C_e}}$$

Thus, if the value of the capacitor Ce is such that the resonance frequency Fres_e is substantially equal to the excitation frequency (Fres_e=Fe), this circuit will act as a bandpass filter on the excitation current and will attenuate the harmonics component of the excitation signal at the frequency 2·Fe. This attenuation depends on the quality Q factor of the circuit, given by the following expression:

$$Q = \frac{2\pi.L.\text{Fres\_e}}{R};$$

Furthermore, the gain at 2·Fres_e is given by:

$$G(2F_{res_e}) = \frac{2}{\sqrt{9Q^2+4}} \cong \frac{2}{3Q}$$

The sensor further comprises an analysis or conditioner module 1 configured to recover and analyse a raw SPM measuring signal in order to remove undesirable frequency components of the SPM signal and only keep the useful frequency component of the SPM signal. The analysis module 1 comprises:
- an analysis impedance Za can be constituted by an analysis capacitor Ca and an analysis resistor Ra mounted in series between the two end terminals 21, 22 of the midpoint coil P11-P12;
- an analysis chain A configured to provide an SPM signal containing useful information to 2·Fe which is usable by an external control unit, or control unit integrated to the sensor, this analysis chain comprising, for example, amplification and filtering circuits.

The current passing through the analysis impedance Za thus corresponds to the raw SPM measuring signal and the analysis of this current passing through the analysis impedance Za at an analysis frequency Fa equal to an even multiple of the excitation frequency Fe, for example, at an analysis frequency Fa equal to 2·Fe, makes it possible to isolate or extract a useful signal containing the information relating to the field or to the current to be measured.

As for the excitation circuit, the combination of coils LN1 and LN2 and of impedance Za forms series RLC-type circuit with a resonance frequency Fres_a, below called "analysis resonance frequency". This analysis resonance frequency equals:

$$F_{res\_a} = \frac{1}{2\pi\sqrt{2L_N C_a}}$$

In practice, the analysis frequency Fa is advantageously substantially equal to the analysis resonance frequency Fres_a.

Embodiment with 2 SPM Coils, Ze=Ce, Le

Figure 2:
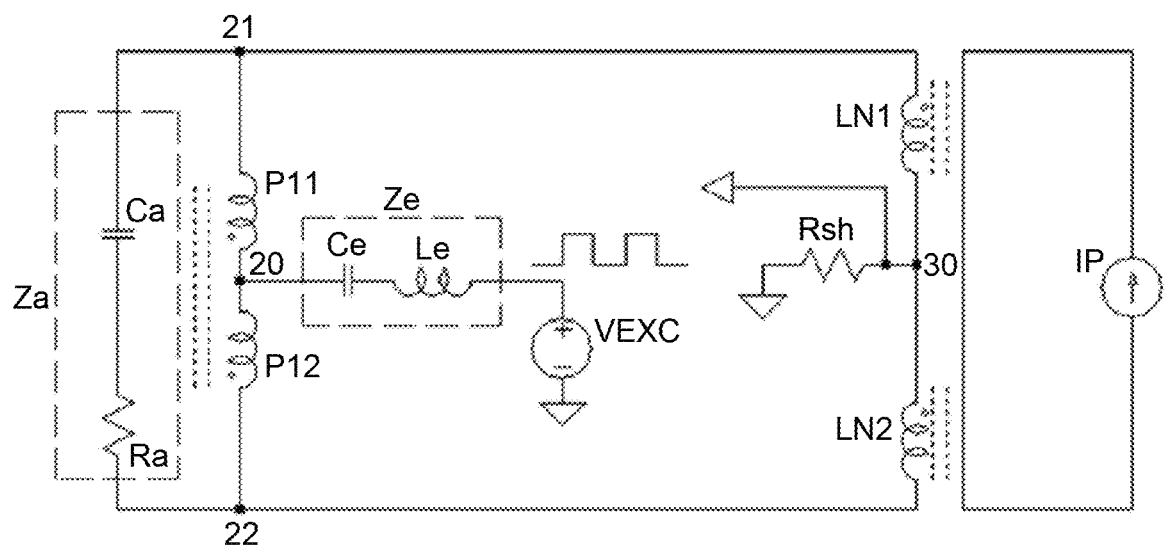
FIG. 2 is a simplified electronic diagram of the sensor according to another embodiment, in which an inductor Le is added to the excitation impedance Ze.

An electronic mounting of the sensor according to another embodiment is illustrated in FIG. 2, in which the excitation impedance Ze, comprises a capacitor Ce and an inductance Le.

It is shown above that the attenuation of the level of the order 2 harmonics depends on the quality Q factor of the circuit. Yet, by construction, the SPM coils generally have a relatively mediocre quality factor at the frequencies considered, of around 3 to 5, which would make it possible to reach an attenuation (opposite the gain) of around 4 to 8. To improve this attenuation, it is possible to add to the mounting of FIG. 1, an excitation inductor Le (for example, a coil) at high quality factor, with an inductance value substantially greater than that of the SPM coils and an insignificant resistance before that of the SPM coils.

The mounting of FIG. 2 thus corresponds to the mounting of FIG. 1, in which the excitation impedance Ze further comprises an excitation inductance Le connected between the excitation capacitor Ce and the excitation voltage generator VEXC, in order to improve the quality factor of the excitation to decrease the distortion level to the frequency 2·Fe.

In this configuration, the resonance frequency Fres_e of the excitation circuit now equals:

$$F_{res\_e} = \frac{1}{2\pi\sqrt{\left(L_e + \frac{L_N}{2}\right)C_e}}$$

Furthermore, the overall quality factor of the circuit is now close to that of the coil Le thus added. It is thus possible to reach a quality factor of around 30 to 50, which leads to attenuations of around 45 to 75, that is ten times more than only with the SPM coils.

Optionally, when measuring the excitation current is necessary or considered, a measuring resistance of the excitation current Rsh can be added between the reference potential and the common terminal 30 of the transducer. Measuring the excitation current is particularly useful when it is sought to carry out a prior calibration step, in order to seek the optimal value of the excitation frequency to be injected into the SPM coils for which the excitation current level is maximum. Such a calibration for seeking the optimal excitation frequency will be described in more detail below.

Figure 12:
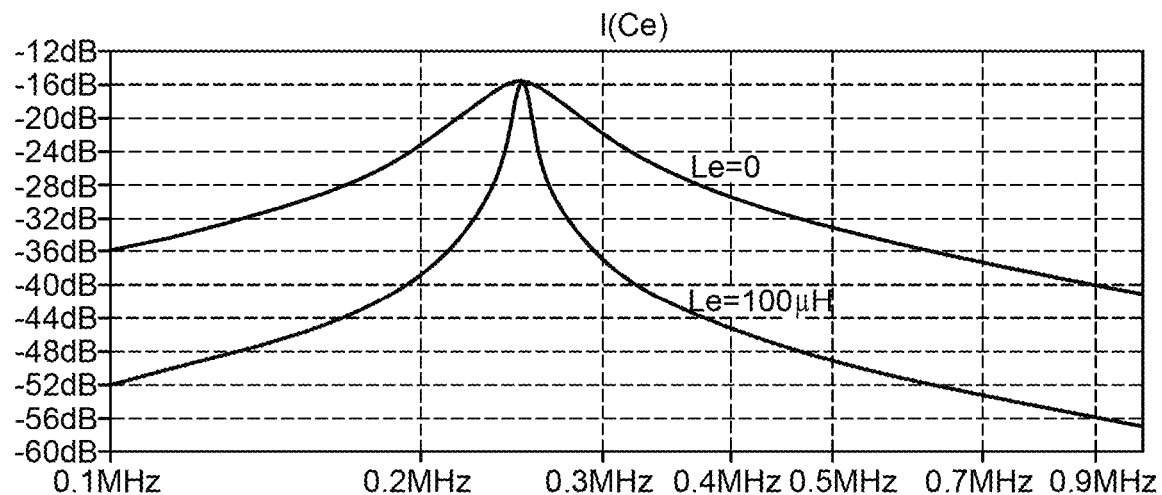
FIG. 12 is a graph showing the attenuation of the analysis frequency Fa of an interfering signal present in the excitation voltage, with the addition of the inductor Le of FIG. 2.

FIG. 12 illustrates the improvement of the filtering obtained by adding a series inductor Le in the excitation circuit. I(Ce) is the current circulating in the capacitor Ce and therefore the excitation current. The excitation resonance frequency Fres_e is 250 kHz in this example, and also chosen equal to the excitation frequency Fe. An interfering signal present in the excitation voltage at the analysis frequency Fa=2·Fe, that is at 500 kHz, is thus attenuated by around 32 dB without series coil Le compared to nearly 50 dB with a series coil Le of 100 μH, which represents almost a factor of 10.

Embodiment with 2 SPM Coils, Ze=Ce, Le and Za=Ca, La

The mounting of FIG. 2 assumes an almost perfect pairing of the SPM coils, such that only the useful frequency 2·Fe appears in the signal detected at the receiving circuit, namely the current passing through the impedance Za. Yet, this perfect pairing can be difficult to obtain in practice, and the imbalance between the SPM coils induces at the output signal (namely the current circulating in the impedance Za), a component at the excitation frequency Fe which can be of amplitude which is a lot greater than the frequency of the useful signal, thus degrading the signal-to-noise ratio of the system.

The SPM effect in an SPM coil can be modelled by a voltage source, the level of which is proportional to the magnetic field in which the SPM coil is immersed, and the source impedance of which consists of the SPM coil itself. Thus, if the receiving circuit (the impedance Za) consists of a resistor Ra and a capacitor Ca, the charge circuit of the SPM voltage source is a series RLC circuit. Therefore, again, the presence of a bandwidth circuit is in, the resonance frequency of which will be positioned at the analysis frequency 2·Fe. The interfering component at the frequency Fe will therefore be attenuated, the attenuation level being even higher the quality factor of this circuit is high. If the capacitor is settled for, the quality factor is very low, since it is necessarily lower than that of the SPM coils, due to the addition of the measuring resistance Ra which is generally greater than the resistance of the circuit constituted by the SPM coils. A quality factor of around 2 to 3 can therefore be counted on.

Thus, in the same way as for the excitation circuit, it is possible to add a series inductor in the analysis impedance Za of the conditioning module to significantly increase the quality factor of the conditioning circuit.

Figure 3:
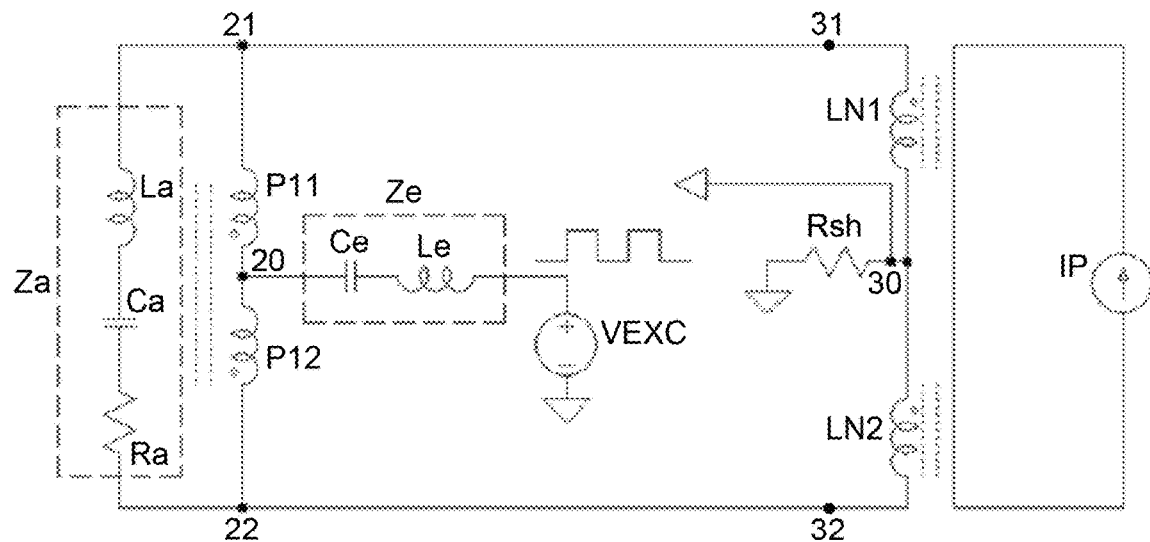
FIG. 3 is a simplified electronic diagram of the sensor according to another embodiment, in which an inductor La is added to the analysis impedance Za.

The mounting of FIG. 3 thus corresponds to the mounting of FIG. 2, in which the analysis impedance Za further comprises an analysis inductor La. The inductor La, the capacitor Ca and the resistor Ra are thus mounted in series between the external terminals 21, 22 of the midpoint coil P11/P12.

In this configuration, the analysis resonance frequency Fres_a of the analysis circuit equals:

$$F_{res\_a} = \frac{1}{2\pi\sqrt{(L_a + 2L_N)C_a}}$$

Moreover, if the analysis frequency Fa is fixed at 2·Fe and if the excitation frequency Fe has been predefined to maximise the excitation current level, via for example, a calibration step mentioned above, the quality factor of the conditioning circuit (or receiving circuit) must preferably be limited, such that, by considering tolerances on the components La and Ca, the attenuation remains reasonable for all the frequency values which can be considered for the excitation frequency Fe.

For example, to guarantee an attenuation lower than 3 dB with a dispersion on the excitation frequency Fe of 3% and a dispersion on the resonance frequency of the analysis circuit Fres_a also of 3%, a limitation to a quality coefficient of around 8 can be considered.

Figure 13:
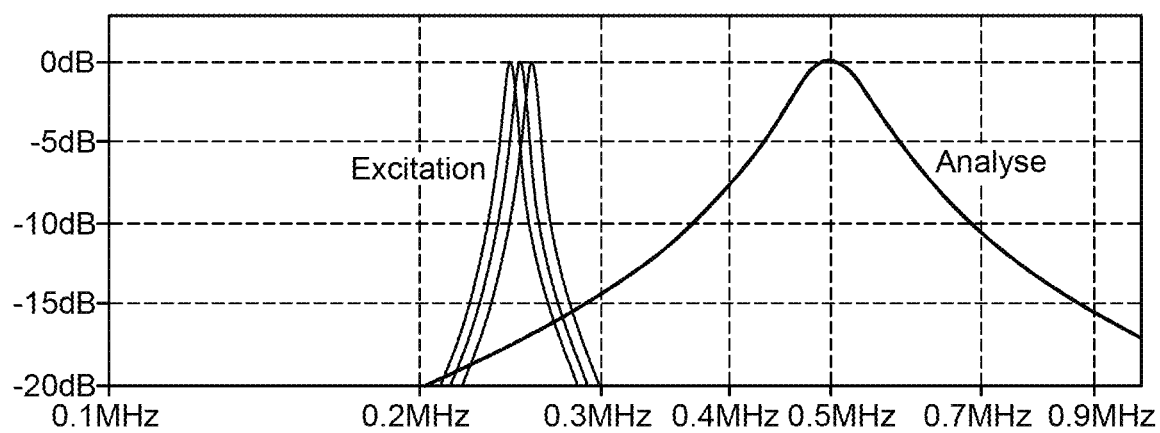
FIG. 13 is a graph illustrating the selectivity difference sought between the excitation and the analysis, according to an embodiment.

FIG. 13 illustrates an example relating to the selectivity difference between the excitation and the analysis. The resonance frequency of the excitation can vary, due to tolerances on the components (in this case, +/−5% on the value of the excitation series coil). It is thus necessary that the analysis frequency which is double the excitation frequency is in the bandwidth of the receiving filter.

Embodiment with 2 SPM Coils, Ze, Za and Transformer T1

Figure 4:
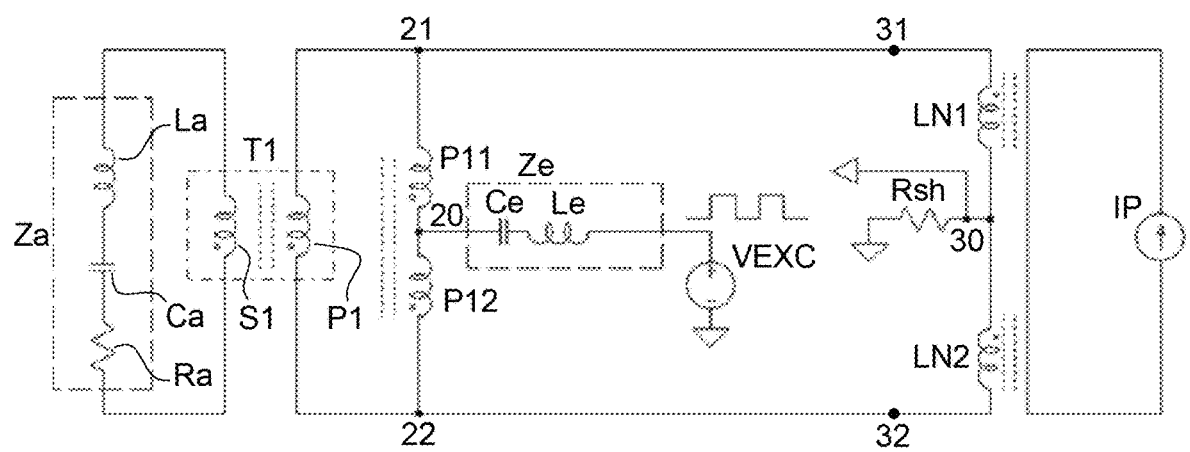
FIG. 4 is a simplified electronic diagram of the sensor according to another embodiment, in which an adaptation transformer T1 is added.

In the mounting illustrated in FIG. 4, a transformer T1 is inserted between the midpoint coil P11-P12 and the analysis impedance Za, in order to adapt the impedance of the analysis circuit and increase the output level of the signal received by the impedance Za.

The transformer T1 is constituted by a primary winding P1 and a secondary winding S1. The primary winding P1 is connected to the external terminals 21, 22 of the midpoint coil P11-P12, and the secondary winding S1 is connected to the terminals of the analysis impedance Za.

The operation of this circuit is similar to that of FIG. 3.

Embodiment with 2 SPM Coils, Ze, Za and Transformer T2

Figure 5:
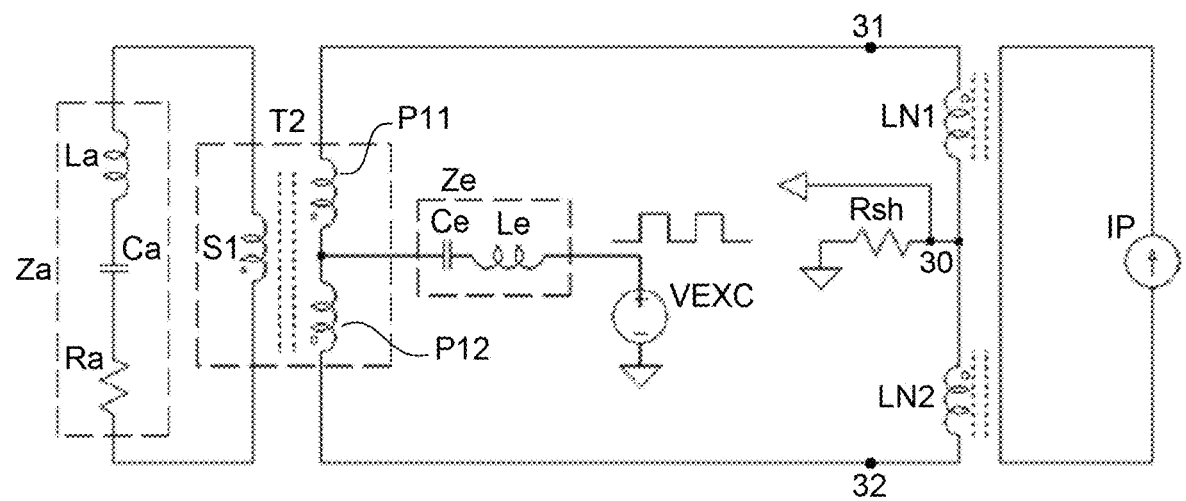
FIG. 5 is a simplified electronic diagram of the sensor according to another embodiment, in which the functions of the transformer T1 and of the midpoint coil of FIG. 4 are grouped together in a single component T2.

In the mounting illustrated in FIG. 5, a single transformer T2 is used to perform the functions of the midpoint coil P11-P12 and of the transformer T1 of the circuit of FIG. 4. Thus, the primary winding of the transformer T2 which is connected to the terminals 31, 32 of the transducer is configured to perform the function of the midpoint coil of FIG. 4 and the secondary winding which is connected to the terminals of the analysis impedance Za is configured to perform the adaptation function of the transformer T1 of the circuit of FIG. 4.

Embodiment with 2 SPM Coils, Position of the Impedance Ze

Figure 6:
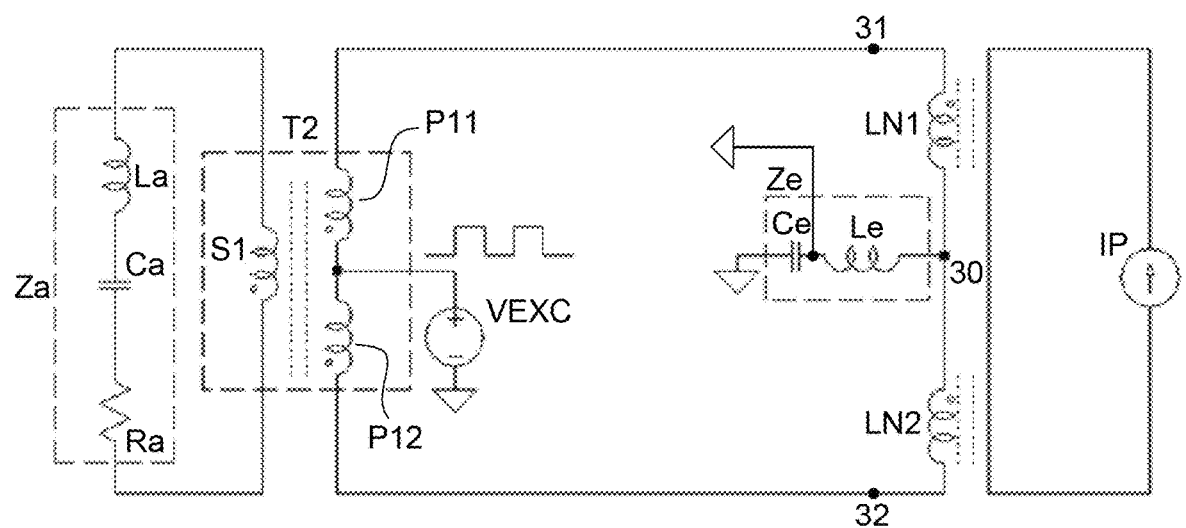
FIG. 6 is a simplified electronic diagram of the sensor according to another embodiment, in which the excitation impedance Ze is mounted between the common terminal of the transducer and the common potential.

In the mounting illustrated in FIG. 6, contrary to the mounting of FIG. 5, the excitation impedance Ze is connected between the common terminal 30 of the transducer and the reference potential.

The interest of this configuration resides, in particular, in the option of measuring the excitation current at the terminals of the capacitor Ce for example, which makes it possible to remove the measuring resistance Rsh tending to degrade the quality factor of the circuit, the measurements being generally referenced at the reference potential. The quality factor of the excitation is therefore improved and the common mode voltage at the midpoint of the coil P11-P12 and of the external terminals 31, 32 of the coils LN1, LN2 is reduced.

The configurations illustrated in FIGS. 1 to 6 implementing two SPM coils excited by a single excitation frequency, without feedback circuit, are particularly adapted for measurements where the linearity of the response is not a very important parameter, in particular when the measurement is taken in a slightly interfered electromagnetic environment.

Embodiment with 2 SPM Coils, with Feedback VCR

The configuration of preceding FIG. 6 can be improved by the conventional addition of a feedback circuit or module VCR. Conventionally, the principle of feedback consists of adjusting the feedback so as to obtain a zero SPM measuring signal, and the value of the feedback is thus directly proportional to the field to be measured. This configuration thus offers a good linearity, and is specifically adapted to the interfered electromagnetic environments while preserving a certain simplicity in its production.

Figure 8:
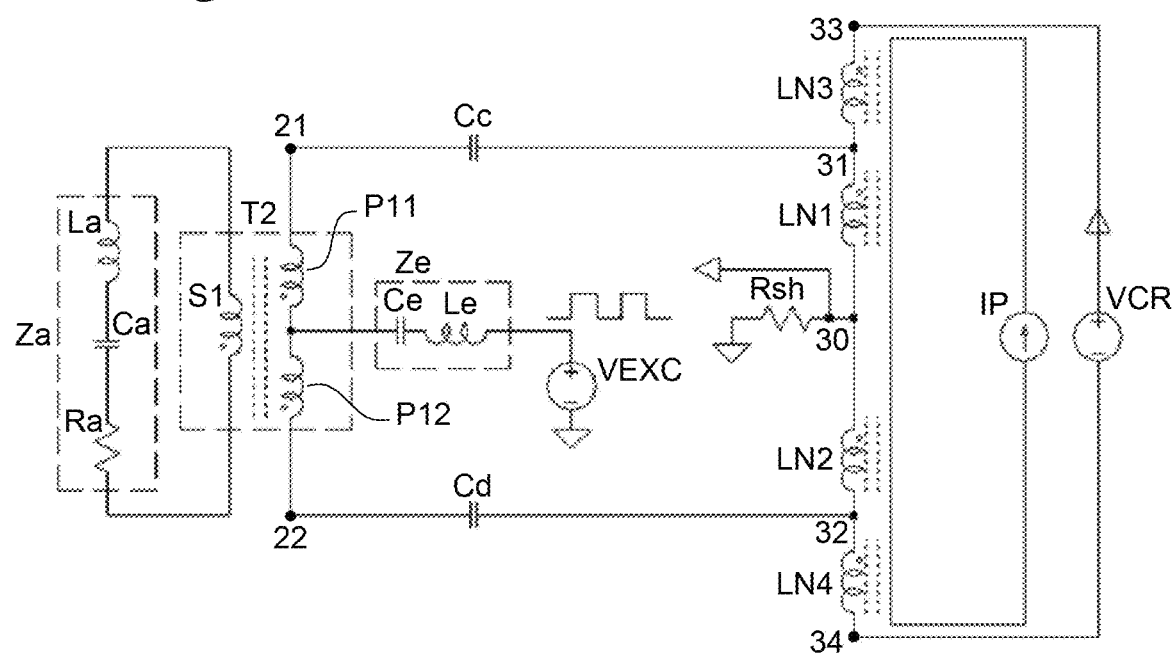
FIG. 8 is a simplified electronic diagram of the sensor of FIG. 7 comprising a feedback circuit, according to another embodiment.

Similarly to the mounting of FIG. 8, the feedback can thus be performed by adding to the mounting of FIG. 6, a feedback voltage generator VCR to the extreme terminals 31, 32 of the transducer, a capacitor Cc between the terminals 21, 31 and another capacitor Cd between the terminals 22, 32.

The feedback voltage generator VCR is configured to generate a feedback current, and the capacitors Cc and Cd, with the same value CCR, are configured to avoid the circulation of the feedback current in the midpoint coil P11-P12, such that the feedback current only passes through the SPM coils in the useful frequency range. Moreover, it can also be wise to isolate the feedback voltage generator VCR from the reference potential by adding, for example, a supply transformer and an isolated amplifier.

The excitation resonance frequency Fres_e and the analysis resonance frequency Fres_a are well understood as modified by the presence of these capacitors Cc and Cd forming a resonating circuit.

Thus:

$$F_{res\_e} = \frac{1}{2\pi\sqrt{\left(L_e + \frac{L_N}{2}\right)C'_e}};$$

and $$F_{res\_a} = \frac{1}{2\pi\sqrt{(L_a + 2L_N)C'_a}}$$

With:

$$C'_e = \frac{2C_e C_{CR}}{C_e + 2C_{CR}};$$

and $$C'_a = \frac{1}{2}\frac{C_e C_{CR}}{C_e + \frac{C_{CR}}{2}}$$

Figure 9:
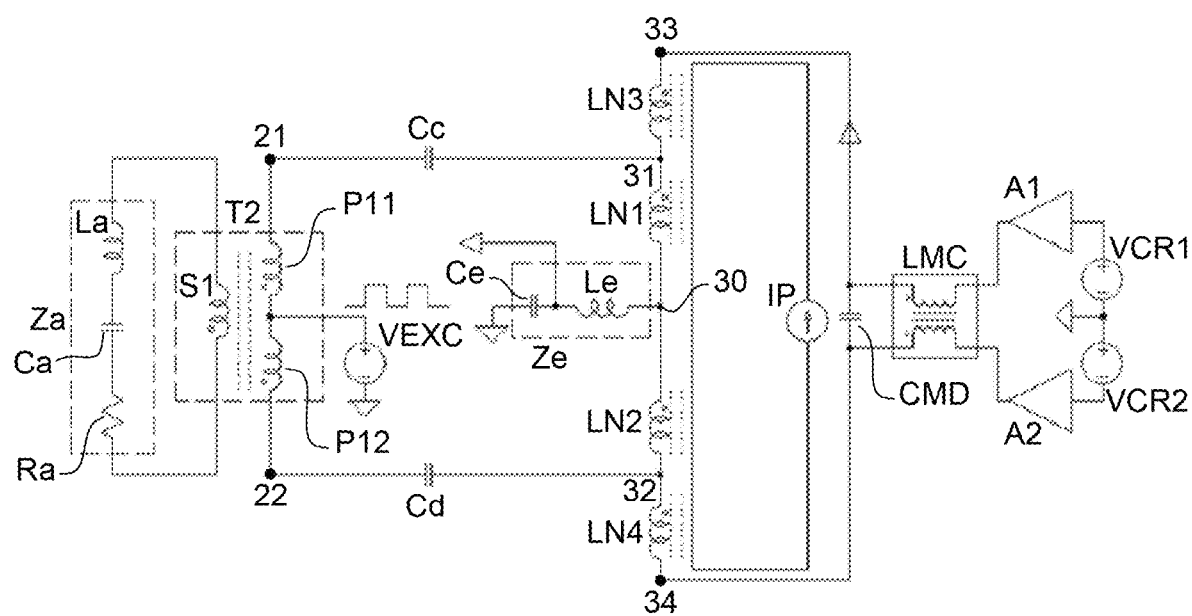
FIG. 9 is a simplified electronic diagram of the sensor of FIG. 7 comprising a feedback circuit, according to another embodiment.

In a variant which is similar to the mounting of FIG. 9, the feedback voltage generator VCR can be formed of two voltage sources VCR1 and VCR2 referenced at the reference potential. The two voltage sources VCR1 and VCR2 are configured to generate voltages of the same value VCR/2, but with opposite polarities, and are connected to the SPM coils LN1 and LN2 through respective amplifiers A1 and A2. Furthermore, to remove the common mode noise induced by these two voltage sources VCR1 and VCR2, a common mode inductor LMC of value a lot greater than the inductance values of the SPM coils and than the value of the excitation inductance Le, can be added. This configuration makes it possible to avoid the use of an isolated supply and of an isolated amplifier, which makes it possible to reduce the costs.

Embodiment with 4 SPM Coils, without Feedback

To improve the removal of a signal at the analysis frequency Fa which could be present in the SPM signal of the transducer with 2 SPM coils in the mountings of the preceding figures, and thus interfering with the measurement, additional SPM coils LN3 and LN4 can be added.

Figure 7:
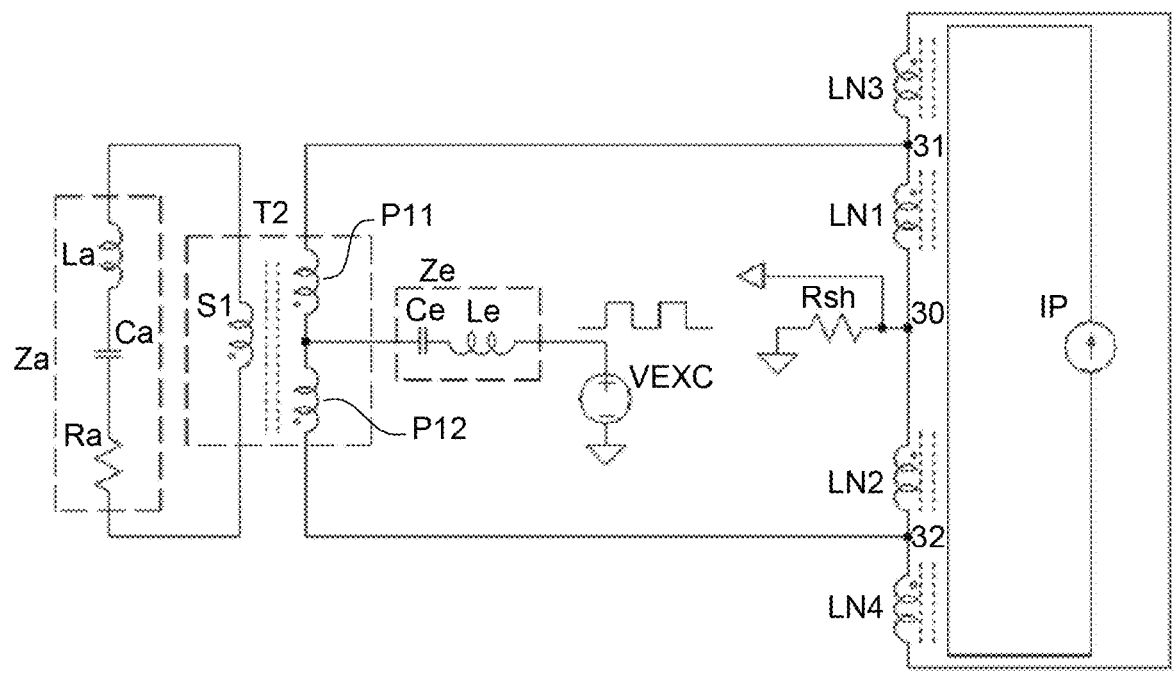
FIG. 7 is a simplified electronic diagram of the sensor according to another embodiment, comprising two additional SPM coils.

For example, as illustrated in FIG. 7, the mounting of FIG. 5 can thus be modified by coupling the first pair of coils LN1 and LN2, to a second pair of superparamagnetic coils LN3 and LN4 substantially identical to the coils of the first pair.

In particular, the coils LN3 and LN4 of the second pair are mounted in series and the two pairs of coils are mounted in parallel, such that the extreme terminal 31 of the first pair of coils is connected to the coil LN3 and the extreme terminal 32 of the first pair of coils is connected to the coil LN4.

In practice, the coils SPM, LN3 and LN4 are subjected substantially to the same magnetic fields as the coils SPM, LN1 and LN2.

Thus, at the analysis frequency Fa, the voltage $e_{12}$ induced by the field variation, excluding SPM effect, in the first pair of coils LN1 and LN2 is substantially identical to the voltage induced $e_{34}$ in the second pair of coils LN3 and LN4. On the mounting of FIG. 7, the polarity points of each coil on the mounting of FIG. 9 with respect to the primary field are such that the voltage between the extreme terminals 31 and 32, developed by the first pair of coils LN1 and LN2 is equal to the voltage $e_{12}$, and the voltage between the extreme coils 31 and 32 developed by the pair LN3 and LN4 is equal to $-e_{34}$. The SPM coils LN1 to LN4 being of substantially identical impedance, the voltage between the extreme terminals 31 and 32 is thus equal to $e_{12}/2-e_{34}/2$, that is about 0. Furthermore, the coils LN3 and LN4 not being passed through by the excitation current Ie, they produce no SPM effect, and the useful SPM voltage (VSPM) produced in the first pairs of coils LN1 and LN2 is therefore located between the extreme terminals 31 and 32, but divided by 2 with respect to the configuration at a pair of SPM coils of FIG. 6.

Thus, although the sensitivity of the circuit is divided by 2, this configuration with four identical SPM coils immersed in the same magnetic field however makes it possible to remove the primary component present at the frequency Fa.

Embodiment: 4 SPM Coils, with Feedback VCR

Just like for the 2-coil embodiment, it is also possible to add a feedback circuit VCR to the mounting of FIG. 7, to obtain a sensor more adapted to the interfered electromagnetic environments.

As illustrated in FIG. 8, the feedback can thus be achieved by adding a feedback voltage generator VCR between the coils LN3 and LN4 of the second pair of SPM coils to the mounting of FIG. 7. The generator VCR is thus mounted between the extreme terminals 33 and 34, and is configured to generate a feedback current.

The capacitors Cc and Cd, of the same value CCR, positioned respectively on the output lines, namely between the terminals 21 and 31, and between the terminals 22 and 32 are configured to avoid the circulation of the feedback current in the midpoint coil P11-P12, such that the feedback current only passes through the SPM coils in the useful frequency range.

In practice, the feedback generator VCR has a low impedance at the analysis frequency Fa. Furthermore, to ensure that the excitation current only passes through the first pair of coils LN1 and LN2, it can also be wise to isolate the feedback voltage generator VCR from the reference potential by adding, for example, a supply transformer and an isolated amplifier.

The resonance frequency Fres_e of the excitation circuit and the resonance frequency Fres_a of the analysis circuit are well understood as modified by the presence of these capacitors Cc and Cd forming a resonating circuit.
Thus:

$$F_{res\_e} = \frac{1}{2\pi\sqrt{\left(L_e + \frac{L_N}{2}\right)C'_e}};$$

and $$F_{res\_a} = \frac{1}{2\pi\sqrt{(L_a + 2L_N)C'_a}}$$

With:

$$C'_e = \frac{2C_e C_{CR}}{C_e + 2C_{CR}};$$

and $$C'_a = \frac{1}{2}\frac{C_e C_{CR}}{C_e + \frac{C_{CR}}{2}}$$

Embodiment: 4 SPM Coils, with Feedback VCR1 and VCR2

The feedback function can also be obtained with two voltage sources VCR1 and VCR2 referenced at the reference potential, as illustrated in FIG. 9. The two voltage sources VCR1 and VCR2 are configured to generate voltages of the same value VCR/2, but of opposite polarity, and are connected to the SPM coils through respective amplifiers A1 and A2.

Just like for FIG. 8, to avoid the use of expensive components linked to the production of a feedback voltage source isolated from the reference potential, two voltage generators VCR1 and VCR2 are used, connected to the reference potential, and a common mode inductor LMC inserted between the generators and the coils LN3 and LN4. The common mode inductor LMC is with a value a lot greater than the inductance value of the SPM coils and than the value of the excitation inductance Le (preferably, ten times greater). The common mode impedance of the branch formed by the coils LN3 and LN4 is thus increased significantly, thus forcing the excitation current to circulate through the coils LN1 and LN2.

However, such that the coils LN3 and LN4 can fulfil their role, a quasi-short-circuit must exist between the external terminals of the transducer at the analysis frequency Fa. To obtain this short-circuit, a capacitor CMD can be placed between the external terminals of the transducer, which will enable the differential mode currents, i.e. those circulating in the same direction in the coils LN1 to LN4, to correctly circulate at the analysis frequency Fa.

Thus, in the mounting of FIG. 9:
    the common mode coil LMC makes it possible to prevent the circulation of the excitation current in the pair of coils LN3 and LN4, while guaranteeing a high bandwidth for the feedback loop; and
    the capacitor CMD makes it possible to ensure a short-circuit of the pair of coils LN3 and LN4 at the analysis frequency Fa.

Calibration for Seeking the Optimal Excitation Frequency

As explained above, the excitation impedance Ze added for the attenuation of the order 2 harmonics component makes it possible to reach a quality factor of around 30 to 50.

However, choosing a fixed excitation frequency Fe can prove to be incompatible with a high quality factor. Improving the quality factor can be accompanied by a significant decreasing of the excitation current when the excitation frequency Fe is displaced from the excitation resonance frequency Fres_e of the excitation circuit.

A solution thus consists of adjusting the frequency of the excitation generator VEXC so as to correspond to an optimal excitation frequency Fopt_e which leads to a higher excitation current level. In other words, by adjusting the value of the excitation frequency Fe to that of the optimal excitation frequency Fopt_e, the excitation current generated is maintained at an acceptable level.

In practice, a control unit can be coupled to the excitation module and be configured to:
    during a prior calibration phase (steps 10 and 10'): seek the optimal excitation frequency Fopt_e to be injected into the SPM coils; and
    during a use phase (step 11) for measuring an external magnetic field: controlling the excitation voltage generator VEXC to generate a voltage at an excitation frequency which is substantially equal to the optimal excitation frequency Fopt_e.

The control unit can be internal to the sensor or external to the sensor, and a means for storing the value of the optimal excitation frequency can be provided in the sensor.

The optimal excitation frequency Fopt_e can be obtained by seeking the excitation frequency Fe for which the excitation current level Ie is maximum. Thus, seeking the optimal excitation frequency Fopt_e can be done by measuring the excitation current Ie during the calibration phase by means of the measuring resistance Rsh provided in the mountings of FIGS. 2-5, 7 and 8, or by means of the excitation capacitor Ce in the mountings of FIGS. 6 and 9.

Figure 10:
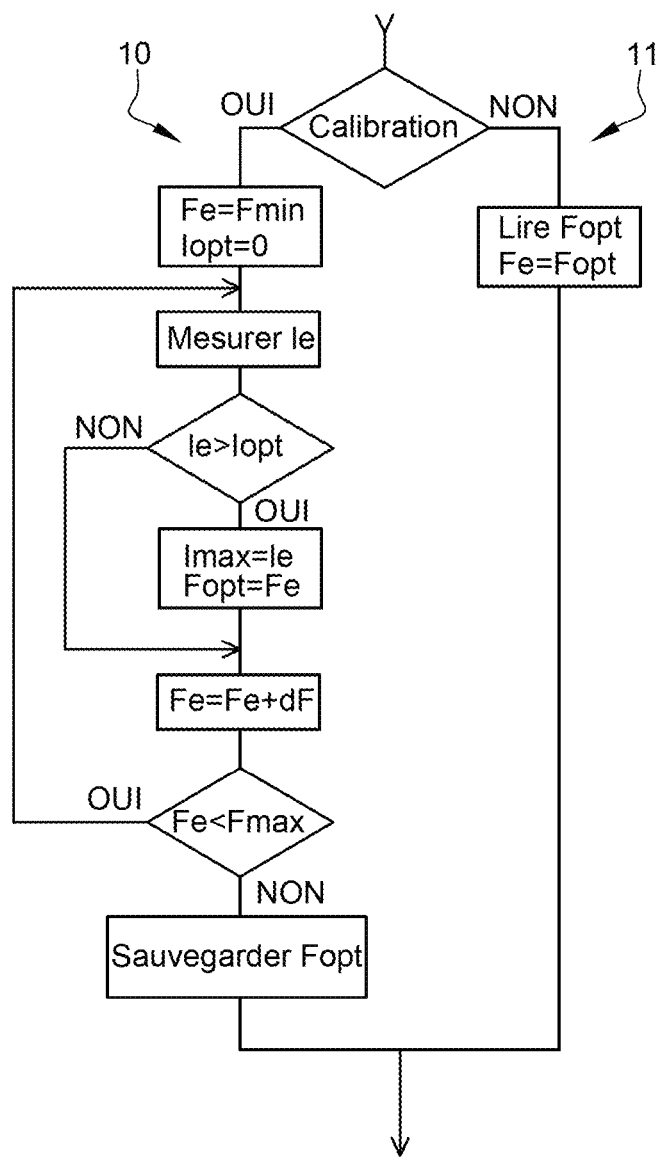
FIG. 10 is a summary diagram of the calibration steps for seeking the optimal excitation frequency, according to a methodology.

FIG. 10 summarily illustrates the steps of seeking, according to a methodology which consists of scanning the excitation frequency Fe in a frequency range (Fe_min; Fe_max), and of seeking in this range the excitation frequency F_opt, for which the excitation current Ie measured, for example, via the resistance Rsh or via the capacitor Ce, is maximum.

Another solution for the calibration phase consists of seeking the optimal excitation frequency Fopt_e to be injected into the SPM coils, for which the sensitivity of the circuit is maximum.

Figure 11:
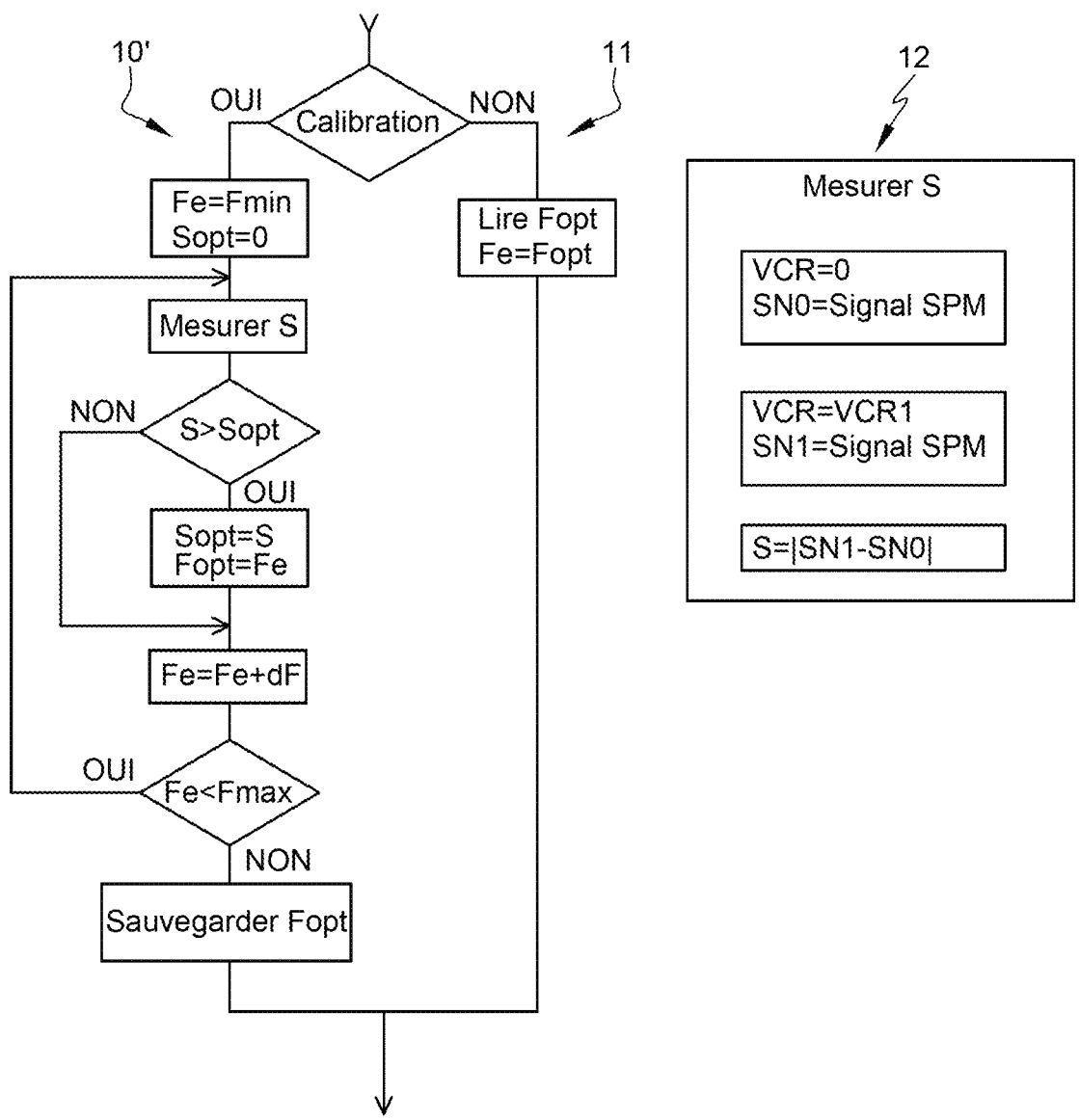
FIG. 11 is a summary diagram of the calibration steps for seeking the optimal excitation frequency, according to another methodology.

FIG. 11 summarily illustrates the steps of seeking, according to another methodology which consists of scanning the excitation frequency Fe in a frequency range (Fe_min; Fe_max), and of seeking in this range the excitation frequency F_opt, for which the sensitivity S of the circuit is maximum.

Measuring the sensitivity S (step 12) of the circuit can be done by measuring the SPM signal level difference obtained by varying the feedback voltage VCR between two predetermined levels VCRmin and VCRmax.

The excitation and analysis frequencies Fe and Fa can be adjusted by the control unit respectively in the ranges [Fe_min; Fe_max] and [Fa_min; Fa_max]. In practice, the excitation frequency Fe will vary by a few percent around a nominal frequency Fe_nom of between a few tens of kHz and a few hundreds of kHz. Likewise, the analysis frequency Fa will vary by a few percent around a nominal value Fa nom also between a few tens of kHz and a few hundreds of kHz, even a few MHz.

In a calibration phase, an optimal excitation frequency Fopt is sought that is stored in a memory, then during the use phase, the excitation module is controlled to generate the excitation signal at this optimal excitation frequency.

The excitation voltage generator VEXC can be a square signal generator, for example a PWM (pulse width modulation)-type generator. The configurations of the present invention tolerating the use of a quasi-sinusoidal excitation signal, the excitation voltage generator VEXC can also be a generator based of an analogue-to-digital converter coupled to a filtering and to a power amplification.

The present invention is naturally not limited to the examples of embodiments described, but extends to any modification and variant which are clear for a person skilled in the art within the limit of the accompanying claims. Furthermore, the technical features of the various embodiments and variants mentioned above can be combined in their entirety or only in part.

The invention claimed is:

1. A magnetic field sensor for measuring a direct current, formed of at least one superparamagnetic material transducer, adapted to be subjected to an external magnetic field to be measured, and electrically coupled to an excitation module and to an analysis module, wherein:
   the transducer comprises at least one pair of coils with superparamagnetic core, the superparamagnetic coils being substantially identical and being connected in series between two extreme terminals of the transducer, a common connection point of the superparamagnetic coils being connected to a reference potential;
   the excitation module is configured to generate and inject an excitation current into the transducer, at a predefined excitation frequency, and comprises at least:
      one midpoint coil mounted in parallel to terminals of the transducer;
      one excitation voltage generator mounted between the reference potential and said midpoint; and
      one excitation impedance configured to form with the superparamagnetic coils a first series RLC-type circuit with a resonance frequency substantially equal to the excitation frequency;
   the analysis module comprising at least:
      one analysis impedance connected to external terminals of the midpoint coil, the analysis impedance being configured to form with the superparamagnetic coils a second series RLC-type circuit with an analysis resonance frequency substantially equal to an analysis frequency; and
      one analyzer that analyzes the current passing through the analysis impedance at the analysis frequency to extract a component at said analysis frequency equal to an even multiple of the excitation frequency.

2. The magnetic field sensor according to claim 1, wherein said analysis frequency is equal to 2.

3. The magnetic field sensor according to claim 1, wherein the excitation impedance is connected between the excitation generator and the midpoint of the midpoint coil.

4. The magnetic field sensor according to claim 1, wherein the excitation impedance is connected between the reference potential and the common connection point of the superparamagnetic coils.

5. The magnetic field sensor according to claim 1, wherein the excitation impedance comprises at least one excitation capacitor.

6. The magnetic field sensor according to claim 1, wherein the excitation impedance comprises at least one excitation capacitor and one excitation inductor, the excitation inductor being connected between the excitation capacitor and the excitation voltage generator.

7. The magnetic field sensor according to claim 1, wherein the midpoint coil consists of two substantially identical windings wound over a single magnetic core.

8. The magnetic field sensor according to claim 1, wherein the analysis impedance is constituted by an analysis capacitor and an analysis resistor mounted in series between the two external terminals of the midpoint coil.

9. The magnetic field sensor according to claim 8, wherein the analysis impedance further comprises an analysis inductor mounted in series with the analysis capacitor and the analysis resistor between the external terminals of the midpoint coil.

10. The magnetic field sensor according to claim 1, further comprising a transformer mounted between the midpoint coil and the analysis impedance, said transformer being constituted by a primary winding and a secondary winding, the primary winding being connected to the external terminals of the midpoint coil, and the secondary winding being connected to terminals of the analysis impedance.

11. The magnetic field sensor according to claim 1, further comprising a transformer comprising a primary winding formed of the midpoint coil and a secondary winding connected to terminals of the analysis impedance.

12. The magnetic field sensor according to claim 1, wherein the superparamagnetic coils of the transducer forms a first pair of superparamagnetic coils, and the sensor further comprises a second pair of superparamagnetic coils substantially identical to said first pair of superparamagnetic coils, the superparamagnetic coils of the second pair being mounted in series, one extreme terminal of the first pair of superparamagnetic coils being connected to one of the coils of the second pair and another extreme terminal of the first pair of superparamagnetic coils being connected to another coil of the second pair.

13. The magnetic field sensor according to claim 1, further comprising a feedback module, said feedback module comprises at least one feedback voltage generator mounted to the extreme terminals of the transducer and configured to generate a feedback current.

14. The magnetic field sensor according to claim 12, further comprising a feedback module, said feedback module comprises at least one feedback voltage generator mounted between the superparamagnetic coils of the second pair and configured to generate a feedback current.

15. The magnetic field sensor according to claim 13, wherein the feedback voltage generator is formed of two voltage sources referenced at the reference potential.

16. The magnetic field sensor according to claim 1, further comprising a calibration module configured to seek an optimal value of the excitation frequency to be injected into the transducer.

17. The magnetic field sensor according to claim 16, wherein the calibration module is configured to:
   vary the excitation frequency of the excitation generator in a frequency range and measure corresponding excitation currents; and
   identify the optimal excitation frequency corresponding to the excitation frequency for which the excitation current level is maximum.

18. The magnetic field sensor according to claim 17, wherein the calibration module is configured to measure the excitation current at the terminals of a resistor mounted between the reference potential and the common connection point of the superparamagnetic coils of the transducer.

19. The magnetic field sensor according to claim 17, wherein the calibration module is configured to measure the excitation current at the terminals of the excitation capacitor.

20. The magnetic field sensor according to claim 16, wherein the calibration module is configured to:
- vary the excitation frequency of the excitation generator in a frequency range and measure a sensitivity of the excitation module; and
- identify the optimal excitation frequency corresponding to the excitation frequency for which said sensitivity is maximum.

\* \* \* \* \*